(12) United States Patent
Van Der Pasch et al.

(10) Patent No.: US 8,730,485 B2
(45) Date of Patent: May 20, 2014

(54) LITHOGRAPHIC APPARATUS AND DEVICE MANUFACTURING METHOD

(75) Inventors: Engelbertus Antonius Fransiscus Van Der Pasch, Oirschot (NL); Emiel Jozef Melanie Eussen, Eindhoven (NL); Erik Roelof Loopstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 357 days.

(21) Appl. No.: 12/948,533

(22) Filed: Nov. 17, 2010

(65) Prior Publication Data

US 2011/0116066 A1 May 19, 2011

Related U.S. Application Data

(60) Provisional application No. 61/261,788, filed on Nov. 17, 2009.

(51) Int. Cl.
*G01B 11/14* (2006.01)
*G03B 27/42* (2006.01)
*G03F 7/20* (2006.01)
*G01D 5/38* (2006.01)

(52) U.S. Cl.
CPC .............. *G03F 7/70775* (2013.01); *G01D 5/38* (2013.01)
USPC .................. 356/616; 355/53; 355/72; 355/77; 356/499; 356/500

(58) Field of Classification Search
CPC ........... G03F 7/70775; G01D 5/34715; G01D 5/34753; G01D 5/38; G01B 11/002
USPC ......... 355/53, 72, 75; 356/499, 521, 614, 616
See application file for complete search history.

(56) References Cited

U.S. PATENT DOCUMENTS

| 7,515,281 | B2 | 4/2009 | Loopstra et al. |
| 7,573,581 | B2 | 8/2009 | Holzapfel |

(Continued)

FOREIGN PATENT DOCUMENTS

| CN | 1728002 | 2/2006 |
| CN | 101561638 | 10/2009 |

(Continued)

OTHER PUBLICATIONS

Korean Office Action dated Nov. 29, 2011 in corresponding Korean Patent Application No. 10-2010-0113864.

(Continued)

*Primary Examiner* — Steven H Whitesell Gordon
(74) *Attorney, Agent, or Firm* — Pillsbury Winthrop Shaw Pittman LLP (57) ABSTRACT

A position measurements system to measure a position of a movable object with respect to another object includes two or more one dimensional (1D) encoder heads mounted on one of the movable object and the other object and each capable of emitting a measurement beam along a measurement direction, one or more reference targets mounted on the other of the movable object and the other object, each reference target including a planar surface with a grid or grating to cooperate with the two or more one dimensional (1D) encoder heads, and a processor to calculate a position of the object on the basis of outputs of the two or more 1D encoder heads, wherein the measurement direction of each of the two or more 1D encoder heads is non-perpendicular to the planar surface of the respective reference target.

14 Claims, 4 Drawing Sheets

(56) References Cited

U.S. PATENT DOCUMENTS

| | | | |
|---|---|---|---|
| 7,636,165 B2 * | 12/2009 | Klaver et al. | 356/499 |
| 2003/0169434 A1 | 9/2003 | Kume | |
| 2005/0168714 A1 * | 8/2005 | Renkens et al. | 355/53 |
| 2006/0023178 A1 | 2/2006 | Loopstra et al. | |
| 2006/0139660 A1 * | 6/2006 | Patrick Kwan | 356/1 |
| 2006/0227309 A1 * | 10/2006 | Loopstra et al. | 355/53 |
| 2008/0094593 A1 * | 4/2008 | Shibazaki | 355/53 |
| 2008/0094594 A1 * | 4/2008 | Shibazaki | 355/53 |
| 2009/0262326 A1 | 10/2009 | Butler et al. | |

FOREIGN PATENT DOCUMENTS

| | | |
|---|---|---|
| JP | 2007-129194 | 5/2007 |
| JP | 2009-252991 | 10/2009 |
| KR | 10-2006-0048801 | 5/2006 |
| KR | 10-2009-0110800 | 10/2009 |
| TW | 200712794 | 4/2007 |
| TW | 200821535 | 5/2008 |
| WO | 2007/142351 | 12/2007 |
| WO | 2008/038752 | 4/2008 |

OTHER PUBLICATIONS

Japanese Office Action mailed May 9, 2012 in corresponding Japanese Patent Application No. 2010-251367.
Chinese Office Action dated Apr. 5, 2012 in corresponding Chinese Patent Application No. 201010544831.7.

* cited by examiner

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/261,788, entitled "Lithographic Apparatus and Device Manufacturing Method", filed on Nov. 17, 2009. The content of that application is incorporated herein in its entirety by reference.

FIELD

The present invention relates to a position measurement system, a lithographic apparatus and a position measurement method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a scanning type lithographic apparatus, it is desirable to control the position of the patterning device and the substrate with high accuracy. To this end, it is desirable to determine the actual position in six degrees of freedom with high accuracy. Interferometer or encoder type position measurement systems might be use to perform these measurements.

An encoder type position measurement system may include an encoder head mounted on the movable object and a reference target mounted on a reference object. The reference target includes a grid or grating arranged on a planar surface. A measurement beam of the encoder head is directed at right angles on the planar surface. $1^{st}$ and $-1^{st}$ order reflections of the measurement beam on the grating are combined in the encoder head. On the basis of intensity difference in this combined signal a movement of the movable object with respect to the reference object in a direction substantially perpendicular to the measurement beam can be determined.

U.S. Pat. No. 7,573,581, the contents of which is herein incorporated by reference in its entirety, discloses a two dimensional (2D) encoder head capable of measuring a position of an object in two directions, i.e. movements substantially parallel to the planar surface of the reference object and movements substantially perpendicular to the planar surface of the reference object. In the encoder head, a single light beam is split in two measurement beams directed at opposite angles to the grid plate. The $+1^{st}$ and $-1^{st}$ order of diffraction reflected beams are brought back together to form a combined signal. On the basis of intensity difference in this combined signal which is measured by detectors arranged in the encoder head, signals representative for position changes of the movable object with respect to the reference object may be determined. These signals may contain information with respect to movements of the movable object substantially parallel to the planar surface of the reference target, but also with respect to movements substantially perpendicular to the planar surface of the reference target.

Since the measurement beams are directed at opposite angles, i.e. mirrored with respect to a main axis of the encoder head, the components of the signals substantially parallel and substantially perpendicular to the planar surface of the reference target may be calculated by subtracting and adding the measurement signals.

US 2003/0169434 discloses another embodiment of an encoder-type displacement detection apparatus, including a light emitting/receiving unit, which includes a light source for emitting a light, an optical splitting unit for splitting returning lights into a plurality of lights, the light from the light source going to and returning from an external optical system to be the returning lights, a polarizing unit for increasing and decreasing quantity of lights transmitted therefrom corresponding to polarization state of the returning lights, and an optical receiving unit which has a plurality of photo-detecting elements for detecting the lights transmitted through the polarizing unit. The light source, the optical splitting unit, the polarizing unit, and the optical receiving unit are unitedly integrated into one unit.

SUMMARY

It is desirable to provide an alternative encoder-type position measurement system, and to provide a lithographic apparatus including such position measurement system. Furthermore, it is desirable to provide an encoder-type position measurement system having flexibility in design, and a method of arranging a position measurement system in a lithographic apparatus having such flexibility.

According to an embodiment of the invention, there is provided a position measurements system to measure a position of a movable object with respect to another object, the system including: two or more one dimensional (1D) encoder heads mounted on one of the movable object and the other object and each capable of emitting a measurement beam having a measurement direction, one or more reference targets mounted on the other of the movable object and the other object, each reference target including a planar surface with a grid or grating to cooperate with the two or more 1D encoder heads, and a processor to calculate a position of the object on the basis of outputs of the two or more 1D encoder heads, wherein the measurement direction of each of the two or more 1D encoder heads is non-perpendicular to the planar surface of the respective reference target.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus includes a position measurement system to determine a position of the support or the substrate table with respect to an object, wherein the position measurement system includes: two or more one dimensional (1D) encoder heads mounted on one of the support or substrate table and the object, and each capable of emitting a measurement beam having a measurement direction, one or more reference targets mounted on the other of the support or substrate table and the object, each reference target including a planar surface with a grid or grating to cooperate with the two or more one dimensional (1D) encoder heads, and a processor to calculate a position of the support of the substrate table on the basis of outputs of the two or more one dimensional (1D) encoder heads, wherein the measurement direction of each of the two or more one dimensional (1D) encoder heads is non-perpendicular to the planar surface of the respective reference target.

According to an embodiment of the invention, there is provided a method of arranging a position measurement system in a lithographic apparatus to measure a position of a stage in the lithographic apparatus in six degrees of freedom with respect to an object, including: providing six one dimensional (1D) encoder heads each capable of emitting a measurement beam in a measurement direction, and one or more reference targets, each reference target including a planar surface with a grid or grating to cooperate with the one or more one dimensional (1D) encoder heads, mounting the one dimensional (1D) encoder heads on one of the stage and the object and mounting the one or more reference targets on another of the stage and the object, wherein the measurement direction of at least two of the six one dimensional (1D) encoder heads is non-perpendicular to the planar surface of the respective reference target, and coupling the six one dimensional (1D) encoder heads to a processor configured to calculate a position of the object on the basis of outputs of said the one dimensional (1D) encoder heads.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
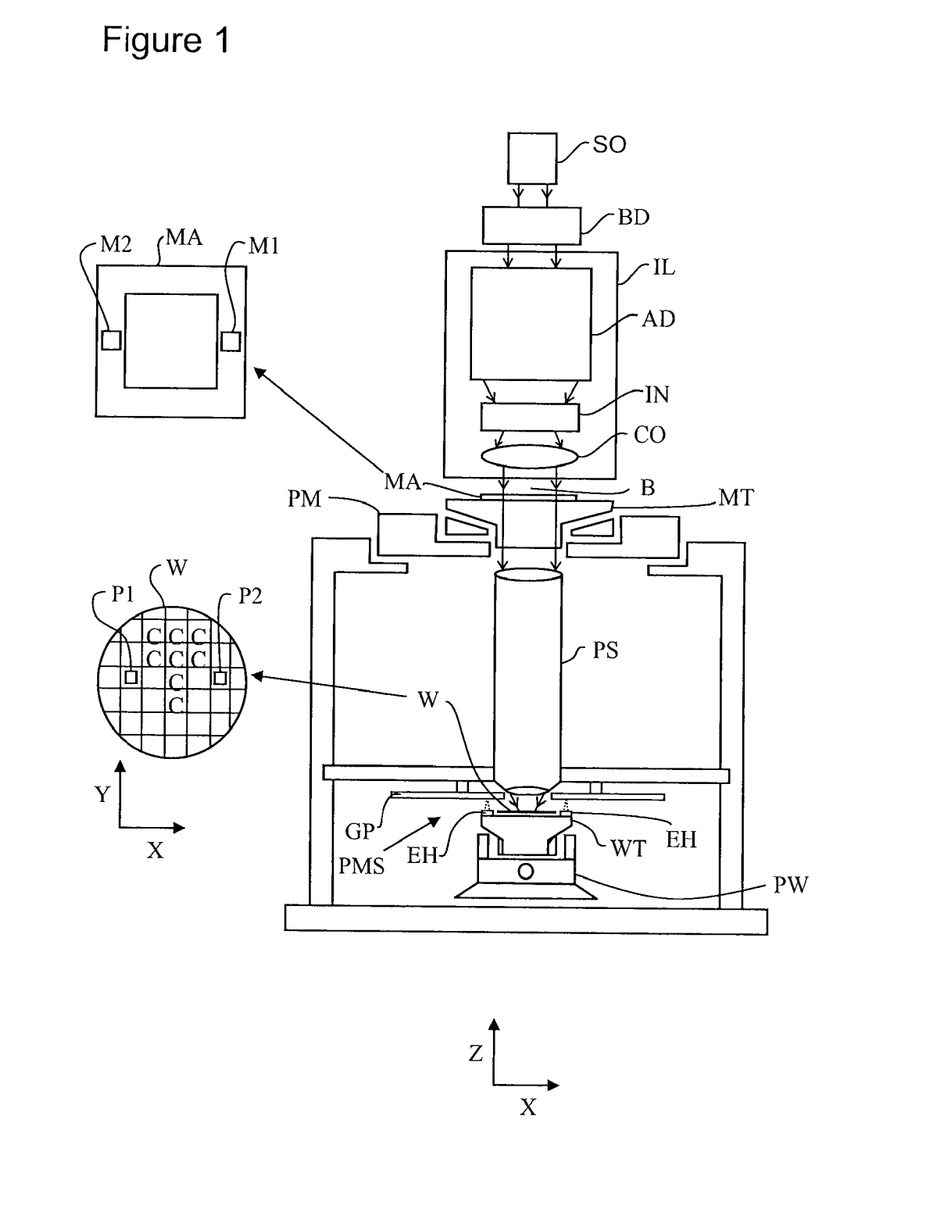
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the lithographic apparatus of FIG. 1, an encoder-type position measurement system PMS according to an embodiment of the invention is provided to measure a position of the substrate table WT. The encoder-type position measurement system PMS is configured to determine the position of the substrate table WT in six degrees of freedom. To this end, multiple encoder heads EH are provided on the substrate table WT, and a grid plate GP is mounted on a frame of the lithographic apparatus, for instance the so-called metrology frame.

The grid plate GP is an object which includes a grid or grating, and does not have to be plate shaped. The grid plate GP may be any object provided with a grid or grating which is used to measure the position of a movable object using an encoder head EH.

Figure 2:
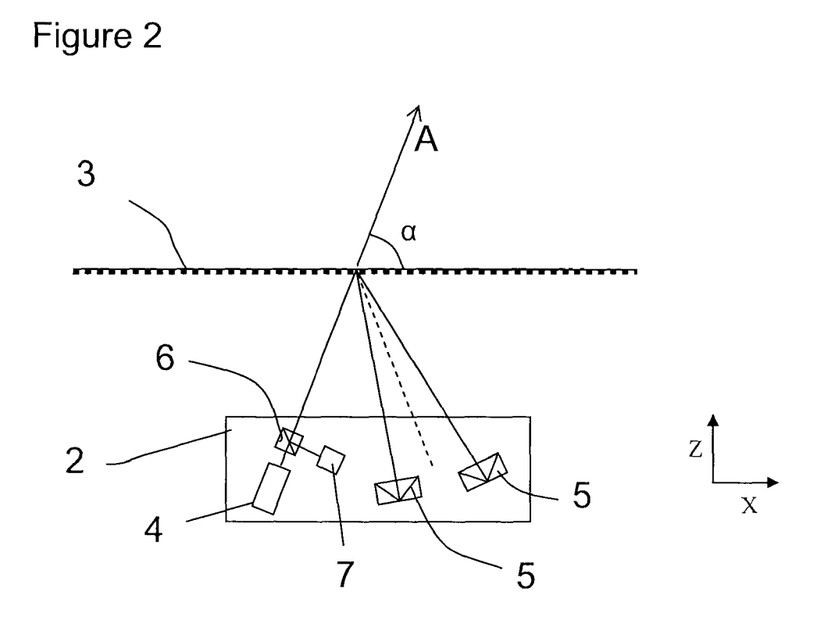
FIG. 2 depicts an encoder head and a grid plate position measurement system according to an embodiment of the invention.

FIG. 2 shows a side view of an encoder head 2 and grid plate 3 of a position measurement system according to an embodiment of the invention. The grid plate 3 includes a planar surface with a grid or grating. Such grid plate 3 is known in the art.

The encoder head 2 is for instance arranged on a movable object and the grid plate 3 is arranged on a reference object, but it is also possible that the grid plate 3 be arranged on the movable object and the encoder head 2 be arranged on the reference object.

The encoder head 2 includes a light source 4 (which can be broadly termed a "radiation source"), for instance a laser source. The light source 4 may be any object, which alone or in combination with other components is configured to emit a light beam at the desired location. The light source 4 may for instance also be a fiber connected to a remote light source.

The light source 4 emits a measurement beam towards the grid plate 3 in a measurement direction A. The measurement beam A is directed at an angle $\alpha$ with respect to the planar surface of the grid plate 3, which angle $\alpha$ is smaller than 90 degrees, i.e. non-perpendicular to the planar surface of the grid plate 3.

The measurement beam will be diffracted on the grid plate 3, and the $1^{st}$ and $-1^{st}$ order reflections are used for further measurement purposes. The $1^{st}$ and $-1^{st}$ order beams are reflected back to the encoder head 2 which includes mirror elements 5 to reflect the $1^{st}$ and $-1^{st}$ order reflections back to the grid plate 3 where the $1^{st}$ and $-1^{st}$ order reflections are reflected to combine a single reflection beam.

The mirror elements 5 may be any reflective elements configured to reflect the $1^{st}$ and $-1^{st}$ order beams parallel to the angle of incidence. Preferably, the mirror elements 5 are retro-reflectors, such as corner cubes and cats eye's.

Intensity differences in this reflection beam are representative of movements of the encoder head 2 with respect to the grid plate 3. The reflection beam will be reflected by the mirror 6 to the detector 7. The detector 7 will provide a signal representative of the movements of the encoder head 2 with respect to the grid plate 3.

The mirror element 6 is for instance a polarizing beam splitter. In such embodiment, polarized light emitted by the light source 2 may pass the polarizing beam splitter, while the reflected light beam coming from the grid plate 3 is fully reflected. Quarter lambda plates may be arranged in the light path to change the phase of the light beam so that the light/radiation emitted by the light source may pass the polarizing beam splitter, and the reflected light beam is reflected is reflected on the polarizing beam splitter. The quarter lambda plates may for instance be arranged on the mirror elements 5.

Since the measurement beam is directed on the planar surface of the grid plate with an angle $\alpha$ smaller than 90 degrees, the encoder head 2 will be sensitive to displacements between encoder head and the grid plate 3 in both the direction substantially parallel and perpendicular to the planar surface of the grid plate 3. Therefore, although the encoder head 3 is of relative simple design, the encoder head 2 may not be capable of correctly determining a position change in X-direction or Z-direction on its own. Further information on the movement of the encoder head 2 with respect to the grid plate 3 is desired to determine the position change.

Figure 3:
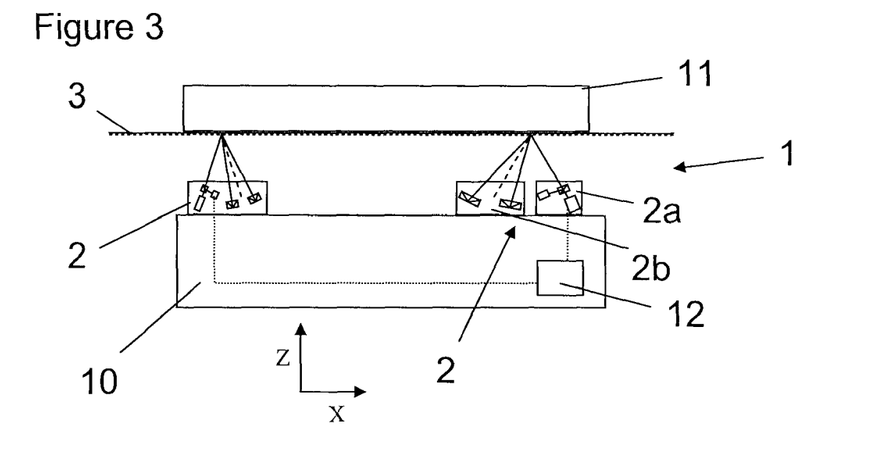
FIG. 3 depicts a side view of an embodiment of an embodiment of a position measurement system according to the invention.

FIG. 3 shows a position measurement system according to an embodiment of the invention. The position measurement system 1 includes a first encoder head 2 similar to the encoder head of FIG. 2 and a second encoder head 2, being constructed of two encoder head parts 2a and 2b, wherein the first encoder head part 2a includes the light source 4 and the detector 7, while the second encoder head part 2b includes the mirror elements 5. Such encoder head 2 constructed from several encoder head parts 2a, 2b may provide further flexibility with respect to the mounting of the position measurement system 1 in a lithographic apparatus.

The encoder heads 2 are mounted on a movable object 10, while the grid plate 3 is mounted on a reference object 11.

The position measurement system further includes a processor 12 connected to the detectors 7 of the encoder heads 2. The processor 12 is capable of determining a position change, or any other position quantity, on the basis of the signals provided by the detectors 7.

The measurement beams of the encoder heads 2 of the position measurement system 1 are both in the X-Z plane directed to the planar surface of the grid plate 3 at an angle smaller than 90 degrees. However, the actual angles at which the measurement beams are directed to the grid plate are different. As a result, both detectors 7 of the encoder heads 2 will provide signals including different components representing movement in the Z direction and in the X directions. Since there are two different signals including information with respect to the X and Z direction, the movement in the X direction and the movement in the Z direction can be calculated by the processor 12.

Thus, the embodiment of the position measurement 1 shown in FIG. 3 provides information with respect to both the X and the Z direction with only one grid plate 3. No grid plate has to be provided parallel to the Z-direction to measure a change in position in the Z-direction, while maintaining the flexibility of using separate 1D encoder heads, i.e. encoder heads having one measurement beams and as a result one direction of sensitivity.

It is remarked that this benefit would still be present if a number of grid plates were arranged next to each other, whereby the planar surfaces of the grid plates would be arranged in parallel.

In one embodiment, the system includes two or more reference targets, wherein the reference targets are arranged next to each other such that the planar surfaces of the one or more reference targets lie substantially in the same plane.

In practice, it will be desirable that the position measurement system 1 is capable of measuring the position of a movable object in six degrees of freedom. In a preferred embodiment of such position measurement system it is proposed to use six separate 1D encoder heads each having its own light source. Such position measurement system provides great flexibility with respect to the mounting of the single encoder heads 2, as long as the measurement directions of the encoder heads 2 are chosen such that the measurement signals obtained from the detectors 7 are sufficiently independent so that movements in different direction can be distinguished in the processing unit 12. Preferably, each of the 1D encoder heads will have a different measurement direction.

Figure 4:
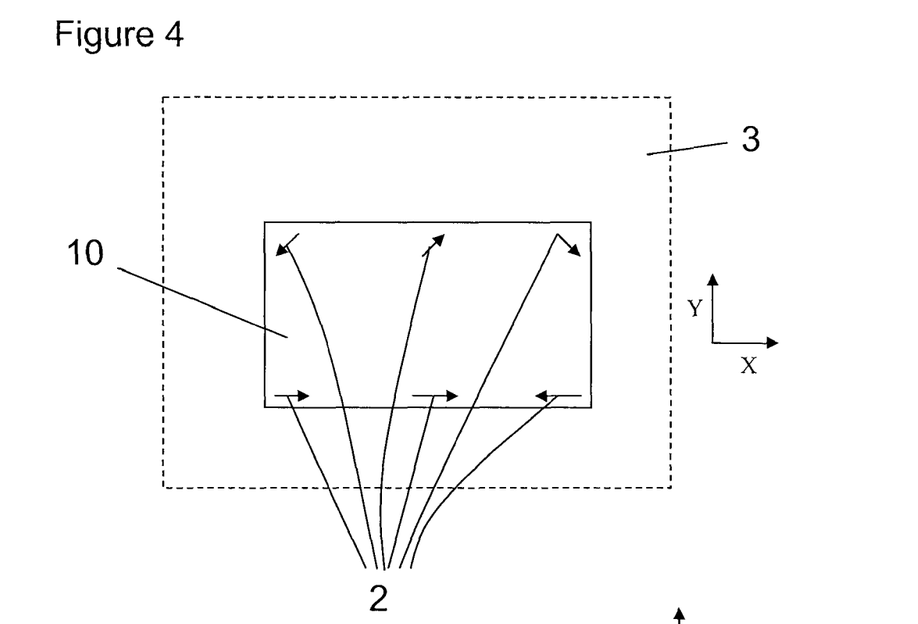
FIG. 4 shows a top view of a configuration of an embodiment of a position measurement system according to an embodiment of the invention.

FIG. 4 shows in top view an example of a configuration of six 1D encoder heads arranged on a movable object 10 which is located under a grid plate 3. The six encoder heads are indicated by an arrow representing the measurement beam direction in top view. Each of the measurement beams will have a Z component, and an X and/or Y component. The measurement beams of each of the encoder heads 2 are directed at different angles at the planar surface of the grid plate 3 therewith obtaining sufficient independence in the signals to calculate in the processing unit from the resulting measurement signals provided by the detectors of the encoder heads 2, the six degrees of freedom of the movable object 10.

It is remarked that the configuration shown in FIG. 4 is in particular suitable for movable objects having a relative large range of movement in the X-direction and Y-direction and having a relative small range in the other directions (Z, Rx, Ry, Rz). Such configuration may for instance be used for a stage in a lithographic apparatus, such as the patterning device support or substrate support.

Figure 5:
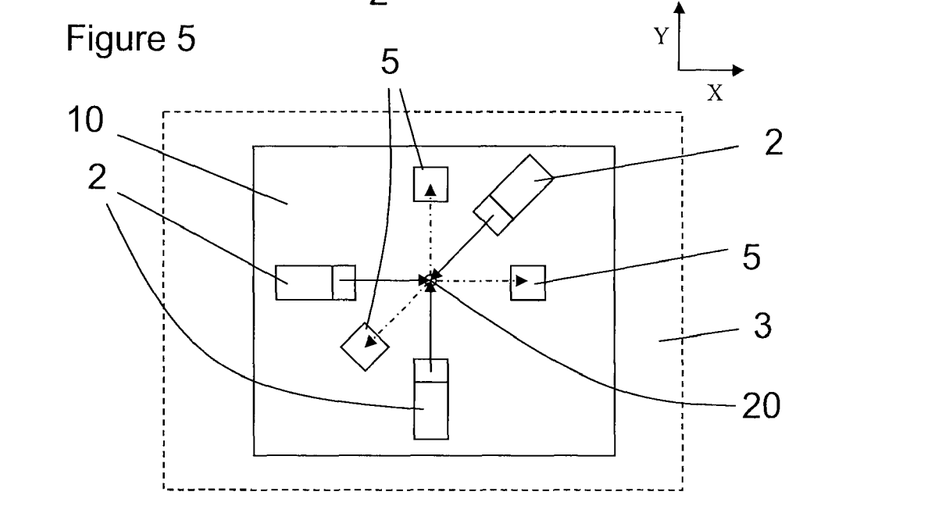
FIG. 5 shows a configuration of encoder heads according to an embodiment of the invention.

FIG. 5 shows a top view of three encoder heads 2, one having a measurement beam in the X-Z plane, one in the Y-Z plane, and one in a X-Y-Z plane. The benefit of the configuration of FIG. 5 is that all the measurement beams are directed to the same measurement location 20.

It is remarked that movement of the movable object 10 in the Z-direction may change the exact position where the measurement beams hit the grid plate 3. Therefore, the angles of the measurement beams and the location of the encoder heads are chosen such that in the nominal position of the movable object 10 the measurement beams are reflected at the same measurement location.

In the configuration of FIG. 5, there are three measurement beams which in combination have components in three directions. This configuration does not provide enough information to calculate the position of the movable object in six degrees of freedom. Therefore, further information has to be obtained to determine the position of the movable object 10 in six degrees of freedom.

This further information may be obtained by further encoder heads having measurement beams directed to the single measurement location 20, but also by encoder heads having measurement beams directed at other measurement locations.

Figure 6:
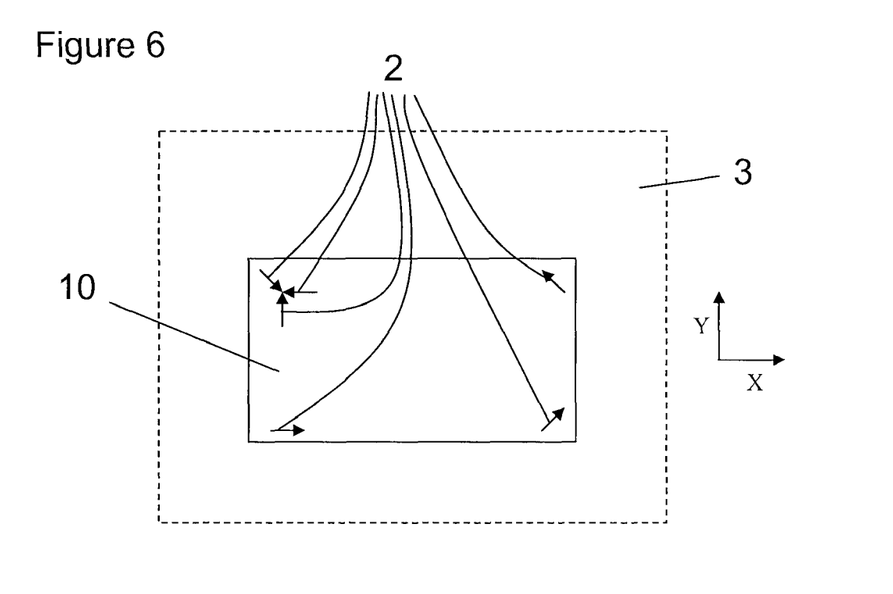
FIG. 6 shows a top view of another embodiment of a position measurement system according to the invention.

FIG. 6 shows a possible configuration incorporating the three encoder heads 2 of FIG. 5 measuring at a single measurement location 20 on the grid plate 3 and three further 1D encoder heads. The encoder heads 2 of the combination of FIG. 5 are arranged at one corner of the movable object 10 and the further three encoder heads 2 are arranged at other corners of the movable object 10.

The measurement signals of the six encoder heads 2 provides enough measurement information to the processing unit 12 to calculate the position of the movable object 10 in six degrees of freedom. Thereby the use of six separate 1D encoder heads 2 provides a large flexibility with respect to the mounting of the encoder heads 2 on the movable object 10 and/or the reference object 11. Furthermore, the position measurement system of the invention provides the possibility to measure the position of a movable object at a single measurement location 20.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position measurement system to measure a position of a movable object with respect to another object, the system comprising:
two or more one dimensional encoder heads mounted on one of the movable object and the other object and each configured to emit a measurement beam along a measurement direction;
a reference target mounted on the other of the movable object and the other object, the reference target comprising a planar surface, arranged at a position along the measurement direction of the measurement beam emitted by each of the two or more one dimensional encoder heads, with a grid or grating to cooperate with the two or more one dimensional encoder heads; and
a processor configured to calculate a position of the movable object on the basis of outputs of the two or more one dimensional encoder heads,
wherein the measurement direction of each of the two or more one dimensional encoder heads is non-perpendicular to the planar surface of the reference target, and
wherein an absolute value of an angle of incidence of a measurement beam of one of the at least two or more one dimensional encoder heads with respect to the planar surface is different from an absolute value of an angle of incidence of a measurement beam of another one of the at least two or more one dimensional encoder heads with respect to the planar surface.

2. The position measurement system of claim 1, comprising six one dimensional encoder heads, and wherein the processor is configured to determine the position in six degrees of freedom on the basis of the six one dimensional encoder heads.

3. The position measurement system of claim 1, wherein the position measurement system comprises one reference target.

4. The position measurement system of claim 1, comprising two or more reference targets, wherein the reference targets are arranged next to each other such that the planar surfaces of the one or more reference targets lie substantially in the same plane.

5. The position measurement system of claim 1, wherein in a nominal position of the object, the measurement beam of a first of the two or more one dimensional encoder heads and the measurement beam of a second of the two or more encoder heads coincide at a single measurement location on one of the reference target.

6. The position measurement system of claim 5, wherein the measurement direction of the measurement beam of the first one dimensional encoder head and the measurement direction of the second one dimensional encoder head are arranged substantially perpendicular to each other in the plane substantially parallel to the planar surface of the respective reference target.

7. The position measurement system of claim 5, comprising at least three one dimensional encoder heads, and wherein a measurement beam of a third of the one or more encoder heads coincides at the single measurement location.

8. The position measurement system of claim 1, wherein the two or more one dimensional encoder heads are mounted on the movable object, and the one or more reference targets are mounted on the other object.

9. The position measurement system of claim 1, wherein each of the two or more one dimensional encoder heads comprises a radiation source.

10. A lithographic apparatus comprising:
   an illumination system configured to condition a radiation beam;
   a patterning device support constructed to support a patterning device, the patterning device being capable of imparting the radiation beam with a pattern in its cross-section to form a patterned radiation beam;
   a substrate support constructed to hold a substrate;
   a projection system configured to project the patterned radiation beam onto a target portion of the substrate; and
   a position measurement system to determine a position of one of the supports with respect to another object, the position measurement system comprising
      two or more one dimensional encoder heads mounted on said one support and the other object, and each capable of emitting a measurement beam along a measurement direction,
      a reference target mounted on the other of said one support and the other object, each reference target comprising a planar surface, arranged at a position along the measurement direction of the measurement beam emitted by each of the two or more one dimensional encoder heads, with a grid or grating to cooperate with the two or more one dimensional encoder heads, and
      a processor configured to calculate a position of said one support on the basis of outputs of the two or more one dimensional encoder heads,
   wherein the measurement direction of each of the two or more one dimensional encoder heads is non-perpendicular to the planar surface of the reference target, and
   wherein an absolute value of an angle of incidence of a measurement beam of one of the at least two or more one dimensional encoder heads with respect to the planar surface is different from an absolute value of an angle of incidence of a measurement beam of another one of the at least two or more one dimensional encoder heads with respect to the planar surface.

11. The lithographic apparatus of claim 10, wherein the position measurement system comprises six one dimensional encoder heads, and wherein the processor is configured to determine the position in six degrees of freedom on the basis of the six one dimensional encoder heads.

12. A method of arranging a position measurement system in a lithographic apparatus to measure a position of a stage in the lithographic apparatus in six degrees of freedom with respect to an object, the method comprising:
   providing six one dimensional encoder heads each capable of emitting a measurement beam in a measurement direction, and a reference target, the reference target comprising a planar surface, arranged at a position along the measurement direction of the measurement beam emitted by each of the six one dimensional encoder heads, with a grid or grating to cooperate with the one or more one dimensional encoder heads,
   mounting the one dimensional encoder heads on one of the stage and the object and mounting the reference target on the other of the stage and the object, wherein the measurement direction of at least two of the six one dimensional encoder heads is non-perpendicular to the planar surface of the respective reference target, and
   coupling the six one dimensional encoder heads to a processor configured to calculate a position of the stage on the basis of outputs of the encoder heads, and
   wherein an absolute value of an angle of incidence of a measurement beam of one of the six one dimensional encoder heads with respect to the planar surface is different from an absolute value of an angle of incidence of a measurement beam of another one of the six one dimensional encoder heads with respect to the planar surface.

13. The method of claim 12, comprising mounting two or three one dimensional encoder heads to direct, in a nominal position of the stage, a measurement beam of the two or three encoder heads to the same measurement location.

14. The method of claim 12, comprising the mounting the six one dimensional encoder heads such that the measurement direction of each of the six one dimensional encoder heads is non-perpendicular to the planar surface of the respective reference target.

\* \* \* \* \*